(12) United States Patent
Will-Cole

(10) Patent No.: US 9,506,153 B2
(45) Date of Patent: Nov. 29, 2016

(54) INTEGRATED COMPOSITE PEROVSKITE OXIDE HETEROSTRUCTURE

(71) Applicant: U.S. Army Research Laboratory ATTN: RDRL-LOC-I, Washington, DC (US)

(72) Inventor: Melanie Will-Cole, Churchville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 24 days.

(21) Appl. No.: 14/488,771

(22) Filed: Sep. 17, 2014

(65) Prior Publication Data

US 2016/0076152 A1  Mar. 17, 2016

(51) Int. Cl.

| | |
|---|---|
| *H01L 21/02* | (2006.01) |
| *C23C 28/04* | (2006.01) |
| *C23C 14/34* | (2006.01) |
| *C23C 14/08* | (2006.01) |
| *C04B 41/50* | (2006.01) |

(52) U.S. Cl.
CPC ......... *C23C 28/042* (2013.01); *C04B 41/5041* (2013.01); *C23C 14/083* (2013.01); *C23C 14/34* (2013.01)

(58) Field of Classification Search
None
See application file for complete search history.

(56) References Cited

U.S. PATENT DOCUMENTS

| | | |
|---|---|---|
| 5,312,790 A | 5/1994 | Sengupta et al. |
| 5,635,433 A | 6/1997 | Sengupta et al. |
| 5,645,634 A | 7/1997 | Ogi et al. |
| 5,693,429 A | 12/1997 | Sengupta et al. |

(Continued)

FOREIGN PATENT DOCUMENTS

WO  WO 01/18830  3/2001

OTHER PUBLICATIONS

Su et al. "Microstructure and dielectric properties of Mg-doped barium strontium titanate ceramics," Journal of Applied Physics vol. 95, No. 3, Feb. 1, 2004, pp. 1382-1385.*

(Continued)

*Primary Examiner* — David Sample
(74) *Attorney, Agent, or Firm* — Christos S. Kyriakou

(57) ABSTRACT

An integrated heterostructure material is achieved by combining the attributes of two perovskite oxide film growth methods, RF sputtering and the metallo-organic solution deposition (MOSD) technique, in combination with employing a novel integrated material design consisting of a $SrTiO_3$ thin film layer which serves as a template to achieve a property enhanced, BST-based thin film overgrowth. In specific the integrated materials design consists of a thin RF sputtered $SrTiO_3$ film (lower layer) which underlies a substantially thicker MOSD over-growth Mg doped BST-based film (upper layer). The inventive material design and combinational film growth fabrication method thereof enables beneficial critical material/device characteristics which include enhanced dielectric permittivity in concert with low loss; low leakage current density; high voltage breakdown strength; high tunability; controlled and optimized film microstructure; and a smooth surface morphology with minimal surface defects. The invention enables miniature highly (voltage) tunable frequency agile devices and/or charge mediated voltage controlled magnetic devices for RF/microwave communications, RADAR, and electronic warfare applications.

19 Claims, 8 Drawing Sheets

(56) References Cited

U.S. PATENT DOCUMENTS

| | | | |
|---|---|---|---|
| 5,776,697 | A | 7/1998 | Lindahl et al. |
| 5,790,367 | A | 8/1998 | Mateika et al. |
| 5,830,591 | A | 11/1998 | Sengupta et al. |
| 5,846,893 | A | 12/1998 | Sengupta et al. |
| 6,096,127 | A | 8/2000 | Dimos et al. |
| 6,115,233 | A | 9/2000 | Seliskar et al. |
| 6,284,586 | B1 | 9/2001 | Seliskar et al. |
| 6,514,895 | B1 | 2/2003 | Chiu et al. |
| 6,528,863 | B1* | 3/2003 | Klee .................. C04B 35/491 257/595 |
| 6,641,940 | B1* | 11/2003 | Li ..................... C04B 35/4682 428/701 |
| 6,803,071 | B1 | 10/2004 | Cole |
| 6,803,134 | B1 | 10/2004 | Cole et al. |
| 7,074,507 | B2 | 7/2006 | Maria et al. |
| 8,053,027 | B2 | 11/2011 | Cole |
| 8,216,701 | B2 | 7/2012 | Cole |
| 2004/0087101 | A1* | 5/2004 | Balakumar .......... H01L 28/56 438/396 |
| 2008/0107885 | A1 | 5/2008 | Alpay et al. |
| 2009/0085437 | A1 | 4/2009 | Cole et al. |
| 2009/0155931 | A1 | 6/2009 | Ma et al. |
| 2009/0297804 | A1* | 12/2009 | Paul .................. C01G 23/006 428/210 |
| 2010/0072531 | A1* | 3/2010 | Kittl ................... C23C 16/409 257/296 |
| 2011/0170226 | A1 | 7/2011 | Oakes et al. |
| 2013/0003254 | A1* | 1/2013 | Koutsaroff .......... C01G 23/006 361/281 |
| 2013/0328735 | A1* | 12/2013 | Ishii ..................... H01G 7/06 343/748 |
| 2015/0054037 | A1* | 2/2015 | Hao .................... H01L 29/205 257/200 |

OTHER PUBLICATIONS

Perovskite structure—definition of Perovskite structure by The Free Dictionary.com, visited Dec. 22, 2015, no author.*
"Enhanced Dielectric Properties from Barium Strontium Titanate Films with Strontium Titanate Buffer Layers" M. W. Cole, E. Ngo, C. Hubbard, S. G. Hirsch, M. Ivill, W. L. Sarney, J. Zhang, S. P. Alpay, J. of Applied Phys. 114, 164107 (2013).
Mohammed et al. Temperature dependence of conventional and effective pyroelectric coefficients for compositionally graded . . . J. App. Phys. 84(6):3322-3325 (Sep. 15, 1998).
Zhai et al. Nonlinear behaviors of the compositionally graded $(Ba,Sr)TiO_3$ thin films derived by a soi-gel process. Appl. Phys. Left. 84(7):1162-1164 (Feb. 16, 2004).
Zhu et al. A comparative microstructural study of compositionally up- and down-graded (Ba, Sr) $TiO_3$ thin films epitaxially grown on (La, . . . Appl. Phys. A 82:709-713 (2006).
Zhu et al. Microstructure of compositionally-graded $(Be_{1-x}Sr_k)TiO_3$ thin films epitaxially grown on $La_{0.5}Sr_{0.5}CoO_3$-covered (100) $LaAlO_3$ . . . J. Appl. Phys. 97, 093503 (2005).
Zhu et al. Epitaxial growth and dielectric properties of functionally graded $(Ba_{1-x}Sr_x)TiO_3$ thin films with . . . J. Vac. Technol. A 20(5):1796-1801 (Sep. 10, 2002).

* cited by examiner

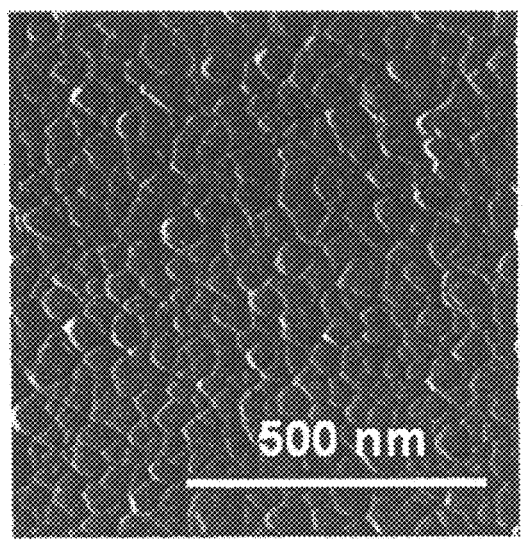
FIG 4A
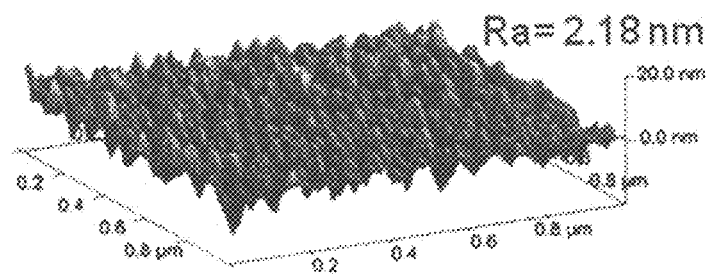
FIG — 4B

INTEGRATED COMPOSITE PEROVSKITE OXIDE HETEROSTRUCTURE

GOVERNMENT INTEREST

The invention described herein may be manufactured and used by or for the Government of the United States of America for government purposes without the payment of any royalties therefor.

BACKGROUND OF THE INVENTION

I. Field of the Invention

This invention relates generally to an integrated composite perovskite oxide heterostructure material design and a combinational film growth fabrication method, thereof, to enable property enhanced, miniaturized, highly tunable analog devices and/or charge mediated voltage controlled magnetic devices for RF/microwave communications, RADAR, and electronic warfare applications.

II. Description of Related Art

Radio Frequency (RF) and microwave (MW) frequency components are of immense importance for defense (and commercial) communications, RADAR, and electronic warfare systems applications. Thin film perovskite oxide high dielectric permittivity non-linear materials have attracted considerable attention for their potential application in voltage controlled tunable RF/MW devices, including, phase shifters, filters, delay lines, resonators, impedance matching networks, voltage controlled oscillators etc. because the (relative) dielectric constant ($\in_r$) of the material can be adjusted with the application of an external electric field. Thin film barium strontium titanate ($Ba_{1-x}Sr_xTiO_3$ or BST) is considered to be one of the leading candidate materials to enable these device components. Barium strontium titanate ($Ba_{1-x}Sr_xTiO_3$ or BST) has strong non-linear response to an applied electric field, both in the paraelectric (PE) and ferroelectric (FE) states. However, in the FE state, there are losses associated with polarization switching. Therefore, for practical tunable device applications BST must be utilized in its PE state. Although the losses are lowered in the PE state, unfortunately so is the dielectric constant and its associated tunability. The current generation of tunable devices is based on uniform composition paraelectric BST films; hence there is a need to improve the material performance such that a high dielectric permittivity is attained without compromising other required performance metrics. At the same time there is a need to enhance dielectric response to create novel multiferroic hetero structure devices.

Maximizing the dielectric response (dielectric permittivity) of BST is critical for achieving high tunability, realizing RF/MW device miniaturization and for creating novel multiferroic heterostructures. Tunability promotes performance agility and high tunability (enhanced dielectric permittivity) is a desirable critical performance metric for tunable devices. The importance of miniaturization cannot be overemphasized for tunable RF/MW device technologies, especially for hand-held communications applications, and/or On-The-Move (OTM)/mobile communications systems both of which demand improved functionality with decreased size and weight. Additionally, to comply with future RF/MW systems architectures, which place stringent requirements on reduced size, weight, and power in concert with reduced component size and numbers the realization of miniaturized high performance voltage controlled BST-based devices is paramount. Maximizing the dielectric response/permittivity, of BST is critical for realizing RF/MW device miniaturization. For tunable BST-based RF/MW devices (e.g. resonators etc.) the size of the device at any particular resonant frequency depends on the inverse square root of the dielectric constant of the BST film, thus the larger the dielectric constant the smaller the device/component. Therefore, BST films with the highest possible dielectric permittivity would be optimal to ensure device miniaturization as well as enhanced tunability.

In addition to achieving high tunability and device miniaturization, it is also critical to innovate new and novel integrated multiferroic devices such as voltage controlled magnetic devices which would replace the current tunable and/or non-reciprocal devices used in present day RF/MW communications and RADAR systems. Commercial off-the-shelf (COTS) non-reciprocal components cost hundreds of dollars each and permanent magnets which are required to bias the magnetic domains of the magnetic medium make these MW components large and bulky. Voltage control of magnetism (converse magnetoelectric (ME) effect) is a critical technology to enable a new class of small size light-weight, low power integrated voltage tunable RF/microwave magnetic devices. Density functional theory (DFT) calculations has recently predicted a linear magnetoelectric (ME) effect, i.e., charge mediated voltage control of magnetism (VCM), for novel heterostructures composed of ferroelectric (FE)/ferromagnetic (FM) films, and that this effect is amplified by more than two-orders of magnitude if the dielectric/FE component (such as BST) were to possess a relatively large dielectric permittivity. A high dielectric permittivity perovskite oxide material, such as BST, would serve to facilitate more charge for a given applied field, hence enhance the magnetic response significantly to enable charge mediated VCM. Therefore, considering charge mediated VCM device applications, the BST thin film component must possess a high permittivity to enhance the ME effect.

However, for the above mentioned device scenarios, in addition to elevating the dielectric constant/permittivity of a film such as BST to achieve component miniaturization, high tunability and/or charge mediated voltage controlled magnetic devices; the BST based devices must still meet other crucial performance criteria. In specific, the enhancement of the dielectric permittivity must be accomplished while maintaining low loss, e.g., tan $\delta \leq 0.03$ (low dielectric loss minimizes undesirable signal attenuation); low leakage current densities, e.g., $10^{-8}$-$10^{-6}$ A/cm$^2$ (high leakage currents limit device reliability severely restricting long term material/device operation and enhances power/battery draw); high break down field strength to ensure extended device operating reliability, and a smooth defect free surface morphology to promote reliable thin film integration and/or mitigate detrimental electrical device shorts. In addition the material process science fabrication methods must be complementary metal oxide semiconductor (CMOS) compatible to insure affordable IC integration, manufacturability and device/system affordability. In other words, for a thin film BST-based voltage controlled device to be useful and employed in engineering applications it must be commercially viable. To be commercially relevant thin film processes technologies must enjoy the economy of scale and affordability associated with the semiconductor industry. Thus the film fabrication process must possess the semiconductor industry-standard attributes to include, but not limited to: low cost large diameter substrate type (e.g., Si, GaAs/III-V, sapphire etc. with wafer diameters ≥4 inches); large area, cost and time effective film growth (sputtering, e-beam, CVD, dip/spin coating etc.); low to moderate process temperatures to facilitate materials integration and the required lithographic, etching, and passivation process steps ($T_{process} \leq 800°$ C.); and compatibility with foundry cluster tools (e.g., wafer size and temperature requirements, utilize standard growth tools).

Various methods for enhancing the permittivity of FE thin films are proposed. As one of them, an extremely high dielectric constant, $\epsilon_r=7000$ at 10 GHz, has been achieved for $SrTiO_3$ films grown by reactive molecular beam epitaxy (MBE) on $DyScO_3$ substrates. The enhanced permittivity is due to the fact that the single crystal $DyScO_3$ substrate promotes the growth of $SrTiO_3$ films under uniform biaxial tensile strain which in-turn causes the FE polarization to lie in the plane of the film, thereby elevating the films permittivity. Although this is a successful approach to achieve a high permittivity, the expensive MBE growth technique combined with the expensive designer substrate ($DyScO_3$) which is size and availability limited, makes this approach non-industry standard (i.e., not integratable/compatible with semiconductor technology) and cost prohibitive. Other concepts to achieve high permittivity BST films involve attaining an engineered structural distortion within the BST film. An in-plane tetragonally distorted film (c<a) has been achieved by varying the $Ar:O_2$ ratios for pulsed laser deposited (PLD) $Ba_{0.5}Sr_{0.5}TiO_3$ (BST50/50) films on (001) MgO substrates. The high permittivity ($\epsilon_r=1200$) for in-plane distorted films, results from the fact that the in-plane ionic polarization is enhanced to form, and develop, with an in-plane applied electric field. Unfortunately the fact that PLD is a non-standard and small area film deposition technique and that MgO is a small area expensive substrate suggests this approach to be very useful for only laboratory scale experiments but not viable from the affordability and manufacturability/foundry points of view. In addition utilization of an in plane electric field is only possible for device structures which are co-planar device designs (i.e., no bottom electrode) and is not viable for the metal-insulator-metal (MIM) configuration which is required for the charge mediated voltage control of magnetic devices and most tunable varactor device designs. Moderately high permittivities ($\epsilon_r=526$) have also been achieved via sputter deposited BST 50/50 films on "surface modified" MgO substrates. The "surface modification" of the MgO substrates involves a pre-anneal process step at 1145° C. for 5 hours prior to the BST growth. Although effective in elevating the BST permittivity, the results are achieved for films grown on non-industry standard, expensive, small area MgO substrates, and this approach introduces added complexity via a high temperature extended temporal duration substrate annealing step, hence this technique is not industry standard and/or cost effective. Other practices to enhance the permittivity ($\epsilon_r \geq 300$) of BST films involves employing thin (~30 nm) physical vapor deposited (PVD) BST/self-buffer layer between the BST active thin film and the support substrate (usually Pt—Si) whereby the buffer layer is grown at a higher temperature (~700° C.) versus that of the BST over-layer film (700° C.). For this situation/scenario the films' dielectric loss and leakage current characteristic are degraded and the films' surface morphology possessed pinhole defects and extreme roughness ($R_{rms}>10$ nm). The high leakage current characteristics ultimately degrade the device long-term reliability and the rough defect laden surfaces would inhibit the integration of the BST with other films (i.e., metal electrodes and/or overlying FM film etc.).

Thus from the prior art summarized herein the achievement of thin film BST which possess an enhanced dielectric permittivity in concert with the other required performance and manufacture criteria is not easily achieved. Therefore there is a continuing need to develop an integrated material design and/or film growth fabrication methodologies which enables the simultaneous enhancement of dielectric permittivity in concert with low loss, low leakage current densities, high break down field strength, and a smooth defect free surface morphology. In addition the material process science methods must be complementary metal oxide semiconductor (CMOS) compatible to insure affordable IC integration, manufacturability and device/system affordability. Such an invention would enable a new class of tunable device components to realize the next generation of RF/MW communications, RADAR, and electronic warfare systems.

SUMMARY OF THE INVENTION

An integrated composite perovskite oxide heterostructure thin film material design and a combinational growth fabrication method, inclusive, is provided to enhance/elevate the materials dielectric permittivity. The high dielectric permittivity is achieved in concert with low loss; low leakage current density; high voltage breakdown strength; high tunability; controlled and optimized film microstructure; and smooth surface morphology with minimal surface defects. Furthermore, the materials and related process science protocols are complementary metal oxide semiconductor (CMOS) compatible, saleable and affordable. The inventive material design and combinational growth film fabrication method thereof; enables miniature highly (voltage) tunable frequency agile devices and/or charge mediated voltage tunable magnetic devices for RF/microwave communications, RADAR and electronic warfare applications. Device components include, but are not limited to, voltage controlled phase shifters, pre-selector (tunable filter) devices, oscillators, delay lines, parametric amplifiers, matching networks, and non-reciprocal devices such as circulators, isolators and gyrators.

An integrated composite perovskite oxide thin film heterostructure material is provided which includes a lower layer of crystallized $SrTiO_3$ perovskite oxide deposited on a substrate with or without bottom electrode; and an upper layer of crystallized Mg-doped $Ba_{1-x}Sr_xTiO_3$ perovskite oxide where x is in the range of 0.36-0.44, inclusive, with 3-5 mol % Mg dopant, in contact with the top surface of the lower layer. Each of the lower and upper layers is in the form of a thin film with the lower layer having a thickness in the range of about 9 nm-20 nm, inclusive, and the upper layer having a thickness of 200-180 nm. Each of the lower and upper layers has a longest dimension generally parallel to the substrate and a thickness generally perpendicular to the substrate, the longest dimension greater than the thickness. The crystallized $SrTiO_3$ lower layer has a large grain microstructure with the longest grain size dimension parallel to the substrate; and the shortest dimension equal to the film thickness which is perpendicular to the substrate; the longest dimension is greater than the film thickness in the preferred embodiments of the present invention.

A composite perovskite oxide thin film heterostructure material is characterized by a high dielectric permittivity while simultaneously achieving low loss; low leakage current density; high voltage breakdown strength; high dielectric tunability, controlled and optimized film microstructure; and smooth surface morphology with minimal surface defects.

One or more electrical contacts, such as an electrode, is disposed between the substrate and the lower layer and/or in contact with the upper layer.

The substrate is a single crystal c-axis oriented (0001) sapphire material in a particular embodiment of the present invention.

An embodiment of an integrated composite heterostructure material includes a lower layer which is crystallized $SrTiO_3$ perovskite oxide on a substrate with a bottom electrode (BE); and an upper layer which is crystallized 5 mol % Mg doped $Ba_{0.60}Sr_{0.40}TiO_3$ perovskite oxide.

A method of fabricating an integrated composite bilayer heterostructure material is described herein including depositing $SrTiO_3$ on a substrate with or without a bottom electrode; crystallizing the $SrTiO_3$ perovskite oxide producing a lower layer; depositing 3-5 mol % Mg doped $Ba_{1-x}Sr_xTiO_3$ perovskite oxide, where x is in the range of 0.36-0.44, inclusive, onto the lower layer; crystallizing the $Ba_{1-x}Sr_x$-$TiO_3$ perovskite oxide where x is in the range of 0.36-0.44, inclusive, producing an producing an upper layer, the upper layer having a bottom surface in contact with the lower layer and an opposing top surface.

The method of fabrication of the inventive heterostructure material is by a combinational film growth methodology which serves control and optimize the film microstructure which benefits the material properties. The combinational film growth fabrication method combines the attributes of two perovskite oxide film growth methods, RF sputtering and the metallo-organic solution deposition (MOSD) technique, both techniques are industry standard, CMOS compatible, large area, scalable, and low cost. RF sputter deposition yields large grain/textured films and high growth rates. MOSD offers ease of film compositional control (ease of doping), smooth (defect) pin-hole free surface morphology and yields high growth rates. The combinational film growth methodology serves to control and optimize the film microstructure which benefits the material/device performance properties.

The film deposition/growth methodology preferably includes RF sputter deposition of the $SrTiO_3$ lower layer and the 5 mol % Mg-doped $Ba_{0.60}Sr_{0.40}TiO_3$ (BST60/40) perovskite oxide upper layer is disposed onto the lower crystallized $SrTiO_3$ layer via the metallo-organic solution deposition (MOSD) technique.

Optionally, a bottom electrode is disposed on the substrate prior to deposition of the lower layer, $SrTiO_3$. In a further option, a top electrode is disposed in electrical communication with the top surface of the crystallized 5-mol % Mg doped BST upper layer. This configuration enables metal-insulator-metal (MIM) tunable capacitor device designs.

Optionally, the lower layer, $SrTiO_3$ is disposed on a substrates without a bottom electrode. In a further option, a top electrode is disposed in electrical communication with the top surface of the crystallized 5-mol % Mg doped BST60/40 upper layer. This configuration enables the co-planar tunable capacitor device designs.

Optionally, a bottom electrode is disposed on the substrate prior to deposition of the lower layer, $SrTiO_3$. In a further option, a ferromagnetic (FM) material is disposed onto the crystallized 5-mol % Mg doped BST upper layer prior to disposing a top electrode in electrical communication with the top surface of the ferromagnetic layer. This configuration enables charge mediated voltage controlled magnetic device designs.

In a further option, an adhesion material is disposed between the substrate and the bottom electrode. In a specific example, a Ti layer is the adhesion material.

The film crystallization steps includes thermal treatment at temperature of 700° C. for 60 min. in oxygen ambience in particular embodiments of a method of the present invention.

A vertical, that is parallel plate voltage controlled capacitor or varactor device is provided according to embodiments of the present invention which includes the integrated composite perovskite oxide heterostructure thin film material described herein. A coplanar tunable device is provided according to the embodiments of the present invention which includes the integrated composite perovskite oxide heterostructure thin film material described herein. A voltage controlled charge mediated magnetic device is provided according to the embodiments of the present invention which includes the integrated composite perovskite oxide heterostructure material described herein.

BRIEF DESCRIPTION OF THE DRAWINGS

FIG. 4A is a reproduction of a plan-view atomic force microscope (AFM) image showing the defect (pin-hole) free surface of the 700° C. annealed integrated composite perovskite oxide heterostructure material according to the present invention;

FIG. 4B is a reproduction of a 3-D AFM micrograph showing the surface morphology of the 700° C. annealed integrated composite perovskite oxide heterostructure material according to the present invention;

Figure 6:
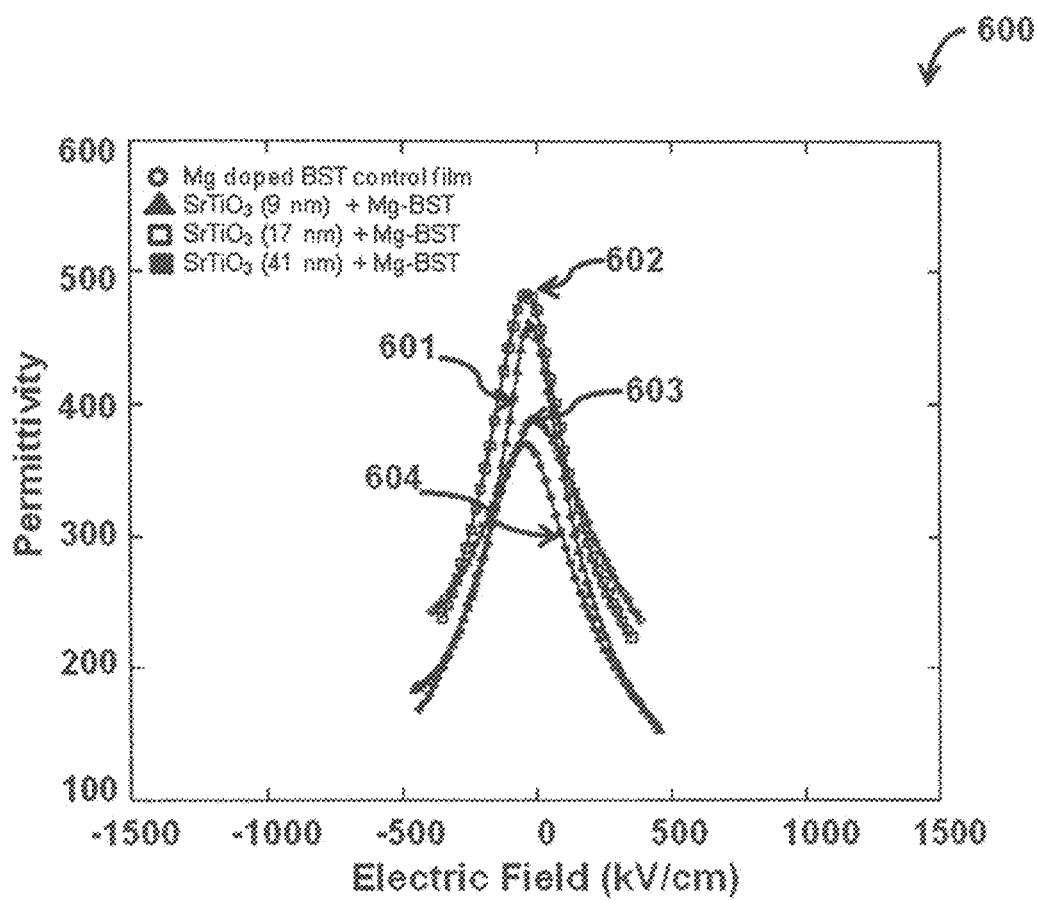
Figure 7:
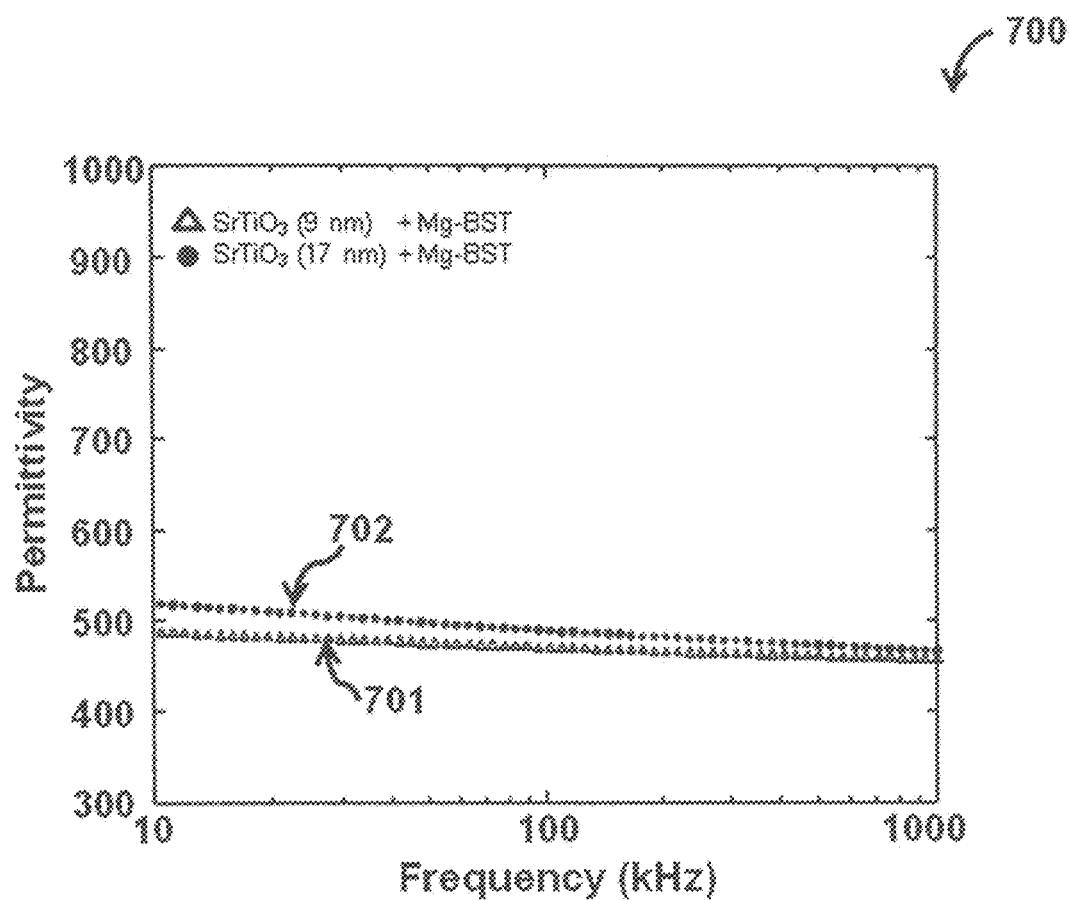
Figure 8:
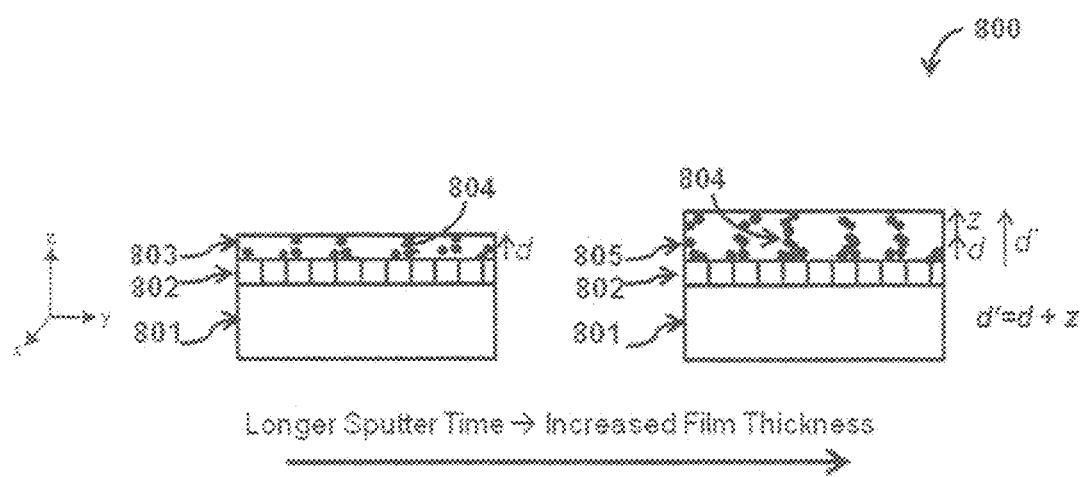

Table 1 displays the experimental data demonstrating the material properties for the integrated composite perovskite oxide heterostructure material according to an embodiment of the present invention;

FIG. 6 is a graph (600) showing the permittivity as a function of applied electric field for the integrated composite heterostructure with SrTiO$_3$ lower layer thickness of 9 nm (trace 601/filled triangles), 17 nm (trace 602/open squares); for reference a uniform composition 5 mol-% Mg doped BST60/40 control film (trace 603/open circles) and a composite heterostructure composed of a 41 nm SrTiO$_3$+5-mol % Mg-doped BST60/40 composite material (trace 604/filled squares) are also shown;

FIG. 7 is a graph (700) showing the frequency dependence of permittivity for the integrated composite heterostructure with SrTiO$_3$ lower layer thickness of 9 nm (trace 701/open triangles) and 17 nm (trace 702/filled circles);

FIG. 8 is a schematic representation of an embodiment of an integrated composite perovskite oxide heterostructure material according to the present invention (800); showing the SrTiO$_3$ lower layer film as a function of layer thickness ranging from 9 to 41 nm on a bottom electrode (802) overlying a substrate support (801). The thinner, 9 and 17 nm, SrTiO$_3$ lower layer films (803) and a thicker, 41 nm SrTiO$_3$ lower layer film (805) are used as the illustrative examples. The TiO$_{2-x}$ phase (804) is represented by the solid dots. The SrTiO$_3$ films possess a blocky columnar grain structure whereby the height of the grain boundary is in the Z-direction. The thickness of the thinner SrTiO$_3$ layers (803) is represented by d and the thickness of the thicker SrTiO$_3$ layer film (805) is represented as d'=d+z. The thicker SrTiO$_3$ layer film (805), 41 nm, possesses more grain boundary area in the z-direction.

DETAILED DESCRIPTION OF THE PREFERRED EMBODIMENTS

An integrated composite perovskite oxide thin film heterostructure material design and a combinational film growth fabrication method, inclusive, is provided to enhance/elevate the materials dielectric permittivity while maintaining low loss, low leakage current characteristics, high breakdown fields strength, high tunability, controlled and optimized microstructure, and smooth defect free surface morphologies. Furthermore, the materials and related process science protocols are complementary metal oxide semiconductor (CMOS) compatible, saleable and affordable. The material design and fabrication method thereof; enables miniature highly (voltage) tunable frequency agile devices and/or charge mediated voltage controlled magnetic devices for RF/microwave communications, RADAR, and electronic warfare applications. Device components include, but are not limited to, voltage controlled phase shifters, pre-selector (tunable filter) devices, oscillators, delay lines, parametric amplifiers, matching networks, and non-reciprocal devices such as circulators, isolators and gyrators.

In the present invention, the integrated composite perovskite oxide material design and the combinational fabrication method, inclusive, is characterized by a high dielectric permittivity while simultaneously achieving enhanced tunability, low loss, low leakage current characteristics and high breakdown voltages. Additional material attributes are smooth defect free film surfaces and controlled/optimized film microstructure, inclusive.

In the present invention, the integrated composite perovskite oxide material design consists of a thinner SrTiO$_3$ (STO) film underlying a thicker acceptor doped Ba$_{1-x}$Sr$_x$TiO$_3$ (BST) film to form the inventive integrated composite heterostructure.

An integrated composite perovskite oxide heterostructure material, is provided according to the present invention which includes a lower layer of crystallized SrTiO$_3$ perovskite oxide, deposited on a substrate; and an upper layer of crystallized Ba$_{1-x}$Sr$_x$TiO$_3$ based perovskite oxide where x is in the range of 0.36-0.44, inclusive, in contact with the top surface of the lower layer.

A combinational perovskite oxide film growth fabrication methodology is provided according to the present invention which includes a RF sputter deposition of the SrTiO$_3$ lower layer film and metallo-organic-solution-deposition (MOSD) of the Ba$_{1-x}$Sr$_x$TiO$_3$-based perovskite oxide upper layer film.

In specific embodiments, an integrated composite bilayer heterostructure material according to the present invention includes a SrTiO$_3$ perovskite oxide layer disposed on a substrate support; an acceptor doped-Ba$_{0.60}$Sr$_{0.40}$TiO$_3$ (BST 60/40) perovskite oxide layer disposed on the SrTiO$_3$ perovskite oxide layer.

It is generally known that non-linear dielectric materials can be used in a wide spectrum of radio frequency (RF)/microwave (MW) tunable devices, including phase shifters, tunable filters, delay lines, resonators, and oscillators because the (relative) dielectric constant ($\in_r$) of the material can be adjusted with the application of an external electric field. Barium strontium titanate (Ba$_{1-x}$Sr$_x$TiO$_3$ or BST) is considered to be one of the forerunner material systems for realization of such tunable components as it has a strong non-linear response to an applied electric field, both in the paraelectric (PE) and ferroelectric (FE) states. It is well known that dielectric permittivity and associated tunability are enhanced for BST in the ferroelectric (FE) phase (below the Curie temperature (Tc)) relative to that in the paraelectric phase (above the Tc), however, the dielectric losses are significantly higher below the Curie point (the losses are associated with polarization switching), as is hysteresis in the dielectric constant, therefore, BST is best utilized within device architectures in its PE state. Unfortunately for practical device applications even in the paraelectric state BST still suffers from achieving the required simultaneous maximization of high permittivity and tunability with minimization of dielectric losses, leakage characteristics and enhanced break-down field strength.

Generally, small concentrations of acceptor dopants can modify the properties of perovskite oxide materials such as BST. Acceptor dopants, such as Ni$^{2+}$, Al$^{2+}$, Ga$^{3+}$, Mn$^{2+,3+}$, Fe$^{2+,3+}$, Mg$^{2+}$, Co$^{2+,3+}$, In$^{3+}$, Cr$^{3+}$, Sc$^{3+}$ etc., typically occupy the B site of the A$^{2+}$B$^{4+}$O$^{2-}_3$ perovskite structure, substituting for Ti$^{4+}$ ions. The charge difference between the lower valence dopant and Ti$^{4+}$ can effectively compensate for oxygen vacancies and thereby have been shown to decrease dielectric losses. Thus, acceptor doping of BST is beneficial to lower dielectric loss.

In specific embodiments of the present invention the upper BST layer is acceptor doped with Mg, in the range of 2-7 mol %, inclusive, more preferably 5-mol % Mg. Mg doping of the thick BST upper layer serves to mitigate oxygen vacancies which in turn reduces the film's dielectric loss. The reduced dielectric loss will minimize signal attenuation and increase the Signal/Noise ratio of the device which is composed of the inventive heterostructure.

It is generally known that $SrTiO_3$ films are inherently low loss and possess low leakage current densities ~$10^{-7}$-$10^{-9}$ A/cm$^2$, and are structurally a good lattice and coefficient of thermal expansion (CTE) match to BST-based films. Thus the $SrTiO_3$ film serves to promote low dielectric loss and sustain low the leakage current densities and high breakdown fields while allowing compatible integration with the overlying 5-mol % Mg doped BST film.

In specific embodiments of the present invention a thinner $SrTiO_3$ layer underlies a substantially thicker Mg-doped BST upper layer.

Generally, each of the perovskite oxide layers of an integrated composite heterostructure material of the present invention has a longest dimension generally parallel to the substrate and a thickness generally perpendicular to the substrate, the longest dimension greater than the thickness.

In specific embodiments of the present invention, each perovskite oxide layer is in the form of a thin film with the $SrTiO_3$ lower layer having a nominal thickness in the range of about 8 to 20 nm, inclusive, more preferably in the range of about 9 nm to 17 nm, inclusive; and the 5 mol % Mg doped BST layer having a nominal thickness in the range of about 300 to 150 nm, inclusive; but more preferably in the range of 200 to 180 nm., inclusive.

Generally, a substrate support may be a single crystal low microwave loss substrate such as sapphire $Al_2O_3$, MgO, $LaAlO_3$, GaAs, CeO, high resistivity Si, quartz, glass or similar support structures. Optionally, the substrate is purified. An exemplary purification of a substrate for high resistivity silicon includes dipping the substrate in acetone and methanol, followed by a weak HF solution to remove/etch native oxide, and then rinsing in de-ionized (DI) water. Optionally, a thermal oxidation layer is grown on high resistivity silicon for use as a substrate in methods, compositions and apparatus of the present invention.

In preferred embodiments of the present invention, a c-plane (0001) epi-ready sapphire substrate is used and prior to film (or electrode) deposition; desirably the sapphire substrate is in situ purified by DC sputtering with Ar ions for 10 min at 3 mTorr and 50 W.

Configurations of the one or more electrodes depends on the intended device architecture and use of the integrated composite perovskite oxide $SrTiO_3$—Mg doped BST thin film heterostructure material of the present invention. For example, in particular embodiments of a parallel plate tunable capacitor or varactor device, one or more "bottom electrodes" is disposed between a substrate support and the lower layer of the integrated composite $SrTiO_3$—Mg doped BST heterostructure and one or more "top electrodes" is disposed on and in electrical communication with the top surface of the integrated composite $SrTiO_3$—Mg doped BST heterostructure. Alternatively, a co-planar device configuration is provided having according to the present invention exclusive of bottom electrodes but including a "top electrode" disposed in contact with the top surface of an integrated composite $SrTiO_3$—Mg doped BST heterostructure disclosed herein. Alternatively, for the voltage tunable magnetic device one or more "bottom electrodes" is disposed between a substrate support and the lower layer of the integrated composite $SrTiO_3$—Mg doped BST heterostructure and a ferromagnetic (FM) material is disposed on top of the integrated composite $SrTiO_3$-BST thin film heterostructure after which a "top electrode" is disposed in electrical communication with the top surface of the FM layer. In particular embodiments, an electrode including one or more noble metals is used; desirably Pt is used as the electrode material.

Figure 1A:
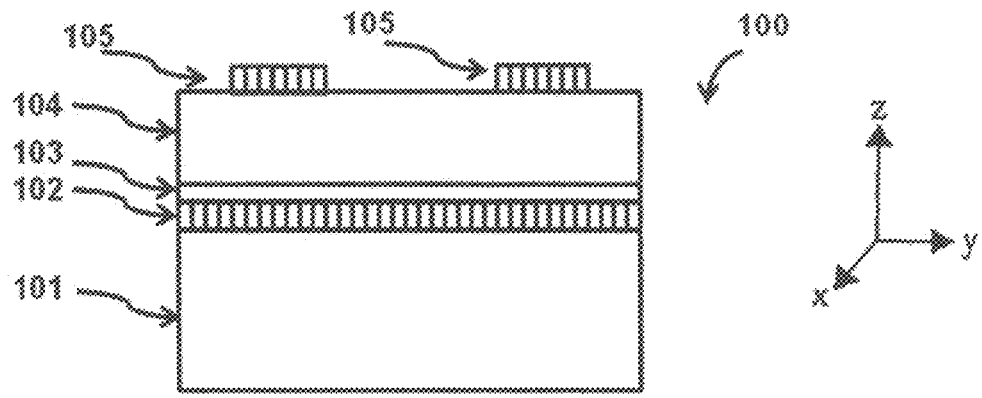
FIG. 1A is a schematic representation of an embodiment of an integrated composite perovskite oxide heterostructure material according to the present invention; where the integrated heterostructure material is integrated within a parallel plate varactor device configuration utilizing one or more bottom electrodes and one or more top electrodes.

FIG. 1A displays a schematic cross-section of a MIM parallel plate variable capacitor device configuration (100) including the integrated composite perovskite oxide thin film heterostructure material having a lower layer (103) of crystallized $SrTiO_3$ perovskite oxide deposited on a substrate (101) with a bottom electrode (102); and an upper layer (104) of crystallized 5-mol % Mg-doped $Ba_{1-x}Sr_xTiO_3$ perovskite oxide where x is in the range of 0.36-0.44, inclusive, with 5-mol % Mg dopant, in contact with the top surface of the lower layer (103). The integrated composite perovskite oxide heterostructure is in contact with a bottom electrode (102) overlying a substrate support (101) in a parallel plate variable capacitor configuration with top electrodes (105). Optionally, an adhesion material such as a layer if Ti is positioned in between the substrate and a bottom electrode.

Figure 1B:
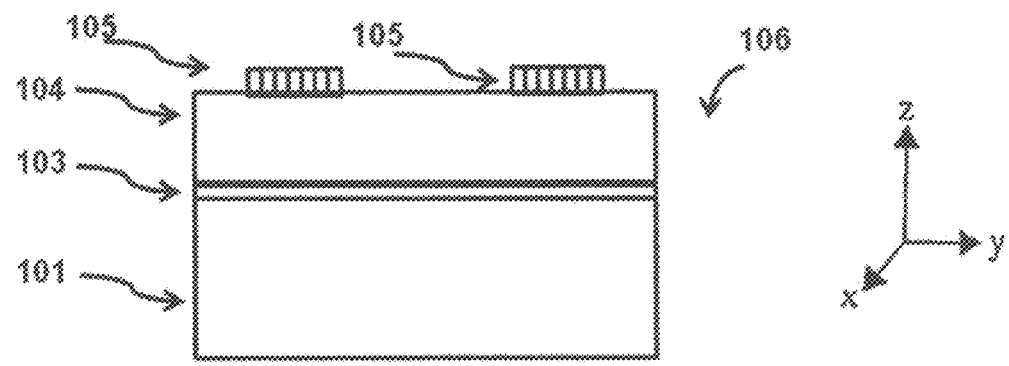
FIG. 1B is a schematic representation of an embodiment of an integrated composite perovskite oxide heterostructure material according to the present invention; where the integrated heterostructure material is integrated within a co-planar device configuration in accordance with an embodiment of the invention utilizing only one or more top electrodes and no bottom electrode.

FIG. 1B displays a schematic cross-section of a coplanar device configuration (106) including the integrated composite perovskite oxide thin film heterostructure material having a lower layer (103) of crystallized $SrTiO_3$ perovskite oxide deposited on a substrate (101); and an upper layer (104) of crystallized 5-mol % Mg-doped $Ba_{1-x}Sr_xTiO_3$ perovskite oxide where x is in the range of 0.36-0.44, inclusive, with 5-mol % Mg dopant, in contact with the top surface of the lower layer (103). The integrated composite perovskite oxide heterostructure is in contact with a substrate support (101) in a coplanar device configuration with top electrodes (105).

Figure 1C:
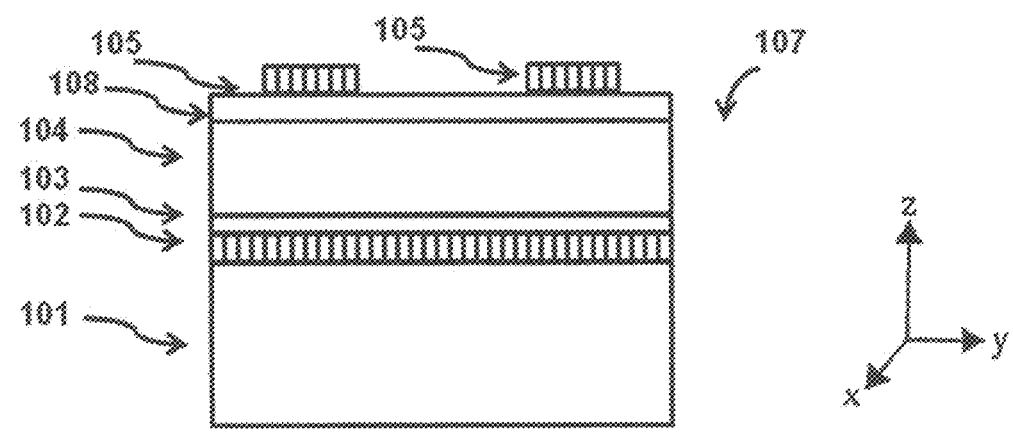
FIG. 1C is a schematic representation of an embodiment of an integrated composite perovskite oxide heterostructure material according to the present invention; where the heterostructure material is integrated with an over-lying FM film and utilizes one or more bottom electrodes and one or more top electrodes, to create the charge mediated voltage controlled magnetic device configuration.

FIG. 1C displays a schematic cross-section of a charge mediated voltage controlled magnetic device configuration (107) including the integrated composite perovskite oxide thin film heterostructure material having a lower layer (103) of crystallized $SrTiO_3$ perovskite oxide deposited on a substrate (101) with a bottom electrode (102); and an upper layer (104) of crystallized 5-mol % Mg-doped $Ba_{1-x}Sr_xTiO_3$ perovskite oxide where x is in the range of 0.36-0.44, inclusive, with 5-mol % Mg dopant, in contact with the top surface of the lower layer (103). A ferromagnetic (FM) layer (108) overlies and is in contact with the top surface of the Mg-doped BST (104). The integrated composite perovskite oxide heterostructure inclusive of the FM upper most layer is in contact with a bottom electrode (102) overlying a substrate support (101) in a charge mediated voltage controlled magnetic device configuration with top electrodes (105) in electrical communication with the top surface of the FM layer (108). Optionally, an adhesion material such as a layer if Ti is positioned in between the substrate (101) and a bottom electrode (102).

A bottom electrode such as Pt, having a nominal thickness in the range of about 150 nm to 200 nm, inclusive, is employed. In preferred embodiments of the present invention, the Pt bottom electrode is 150 nm in thickness.

Desirably, the Pt bottom electrode is DC-sputter in an ambience of 100% Ar with a substrate temperature of 625° C. (instrument set point) actual temperature ~450° C., 3 mTorr and 400 W.

Optionally, an adhesive is disposed between the bottom Pt electrode and the substrate to promote adhesion of an electrode to the substrate. For example, an adhesion material includes a layer of Ti wherein the Ti layer is positioned adjacent to the substrate. An adhesion layer is disposed between a substrate and a bottom electrode such that the relative order of the layers is: substrate-adhesion layer-bottom electrode-lower layer of crystallized $SrTiO_3$ perovskite oxide-upper layer of Mg doped-BST perovskite oxide film in particular embodiments of the present invention. The thickness of the adhesion layer can range from 2-40 nm, preferably in the range of 5-15 nm and in a preferred embodiment, the adhesion layer is 7 nm. Additional illustrative adhesion materials are Cr and Pd.

For example, a layer of Ti, Cr or Pd is optionally disposed between a substrate and an electrode such that the relative order of the layers is: substrate—Ti, Cr or Pd adhesion layer-bottom electrode—lower layer of the crystallized $SrTiO_3$ perovskite oxide—upper layer of the crystallized Mg doped-BST perovskite oxide in particular embodiments of the present invention.

For top electrodes, any material can be selected that will allow for good interface with the underlying film as well as permit low leakage current characteristics. The top electrode can be deposited by any appropriate physical and/or chemical deposition process. The adhesion between the top electrode and the film can be improved by further heat treatment.

In particular embodiments, a top electrode thin film material is Pt with a film thickness of 150 nm and is created by DC sputter deposition.

Desirably, the adhesion of the top electrode to the underlying film is improved by thermal treatment at 400° C. for 10 minutes in an oxygen or air ambiance.

In specific embodiments of the present invention, the integrated composite $SrTiO_3$—Mg doped-BST heterostructure is achieved utilizing a combinational film growth/deposition fabrication technique that is industry standard, scalable and cost effective. In specific, the $SrTiO_3$ perovskite oxide lower layer is RF sputter deposited onto the substrate; the 5 mol % Mg-doped $Ba_{0.60}Sr_{0.40}TiO_3$ perovskite oxide upper layer is deposited via the metallo-organic solution deposition (MOSD) technique, inclusive.

It is generally known that physical vapor deposition (PVD) of perovskite oxide films yields large grain sizes and/or textured films. Large grain sizes are desirable since larger grains are linked to larger dielectric permittivities. Furthermore, a larger-grained microstructure yields less grain boundary area, and since grain boundaries serve as high-leakage paths, leakage currents can be reduced by increasing the average grain size. Sputtering and pulsed laser deposition (PLD) methods are known examples of physical vapor deposition techniques.

Generally, it is difficult to achieve accurate and controlled doping of BST films via PVD techniques like RF-sputtering. However, the MOSD technique offers an accurate and easy means for achieving acceptor doped BST films while at the same time promoting a morphologically smooth and defect/pin-hole free film surface which is required to achieve reliable film integration (minimize breakdown/shorting) with top electrodes and/or in the case of voltage controlled magnetic device configuration, with the overlying FM film.

In specific embodiments of the present invention, the $SrTiO_3$ perovskite oxide lower layer is RF sputter deposited in an ambience of 90% Argon:10% oxygen from a stoichiometric composite $SrTiO_3$ ceramic target with substrate temperature of 700° C. (instrument temperature set point) actual temperature is ~600° C., total pressure of 10 mTorr and power level of 150 W.

The film-bottom electrode interface plays a major role in defining the materials leakage current characteristics. For example, the existence of an amorphous phase at the film/electrode interface, voiding and/or defects results in electrical degradation (i.e., high leakage current densities) associated with poor dielectric breakdown characteristics, therefore the $SrTiO_3$ film should be fully crystallized with minimal defects and voids to promote the device quality insulating values required to enhance the films dielectric breakdown field/voltage.

Generally, subsequent to deposition the lower layer $SrTiO_3$ film the $SrTiO_3$ film is fully crystallized via thermal processing such as rapid thermal annealing (RTA), thermal annealing, and/or conventional furnace annealing (CFA) in air and/or oxygen ambience at temperatures in the range of 625-950° C., inclusive, for a temporal duration in the range of 1 to 180 min, inclusive.

Figure 2A:
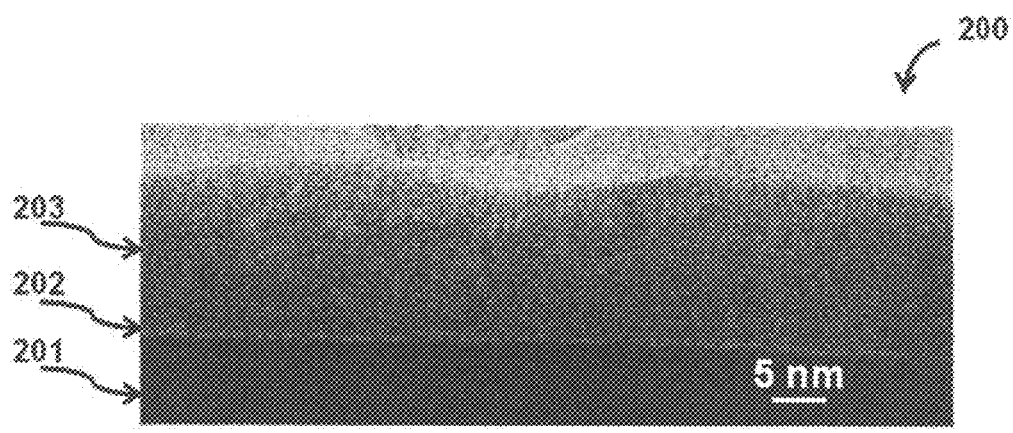
FIG. 2A is reproduction of a cross-sectional view high resolution transmission electron microscope (HRTEM) micrograph (200), showing the smooth abrupt interface (202) between the bottom electrode (201) and the crystallized $SrTiO_3$ film (203)
Figure 2B:
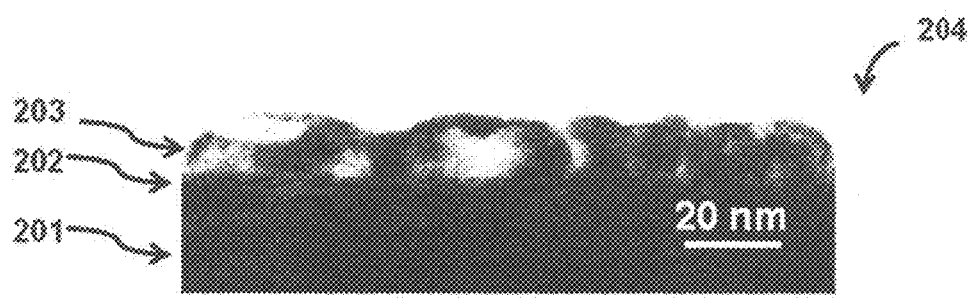
FIG. 2B is a reproduction of a cross-sectional view high resolution transmission electron microscope (HRTEM) micrograph (204), showing that the crystallized $SrTiO_3$ lower layer is a continuous film composed of a large grain microstructure (203) with the longest grain size dimension parallel to the bottom electrode (201)/substrate; and the shortest dimension equal to the film thickness which is perpendicular to the substrate; the longest dimension is greater than the film thickness in the preferred embodiments of the present invention; in a preferred embodiment of the present invention the grains are 17 nm in thickness and 42 nm in lateral length.

In preferred embodiments of the present invention, the $SrTiO_3$ lower layer is crystallized via conventional furnace annealing in flowing oxygen at 700° C. for 60 minutes. Desirably, as shown in FIG. 2A (200) the $SrTiO_3$ film (203) is well crystallized with an abrupt smooth defect and void free $SrTiO_3$ (203)-BE (201) interface (202) without undesirable secondary interfacial phases. Such excellent interfacial quality promotes low leakage current characteristics. Furthermore, as shown in FIG. 2B (204) a large grain microstructure $SrTiO_3$ lower layer film (203) according to an embodiment of the present invention is formed by RF sputtering. Specifically, the crystallized $SrTiO_3$ lower layer is a continuous film composed of a large grain microstructure (203) with the longest grain size dimension parallel to the bottom electrode (201)/substrate; and the shortest dimension equal to the film thickness which is perpendicular to the substrate; the longest dimension is greater than the film thickness in the preferred embodiments of the present invention; in a preferred embodiment of the present invention the grains are 17 nm in thickness and 42 nm in lateral length.

Generally, the MOSD precursor solution required to create the Mg doped-BST involves using carboxylate-alkoxide precursors.

In preferred embodiments of the present invention, the elements of the MOSD precursor solution required to create the Mg doped-BST film involve barium acetate (Ba $(CH_3COOH)_2$), strontium acetate ($Sr(CH_3COOH)_2$), and titanium isopropoxide ($Ti(C_4H_9O_3)_4$) as precursors to form BST60/40. Acetic acid and 2-methoxyethanol ($H_3COOH_2CH_2OH$) are used as solvents, and magnesium acetate is employed as the acceptor dopant precursor. The viscosity of the precursor solution is adjusted using 2-methoxyethanol ($H_3COOH_2CH_2OH$). The precursor elements of the MOSD solution are stoichiometric to yield yMg–(1–y) BST where y=5-mol %.

Figure 3A:
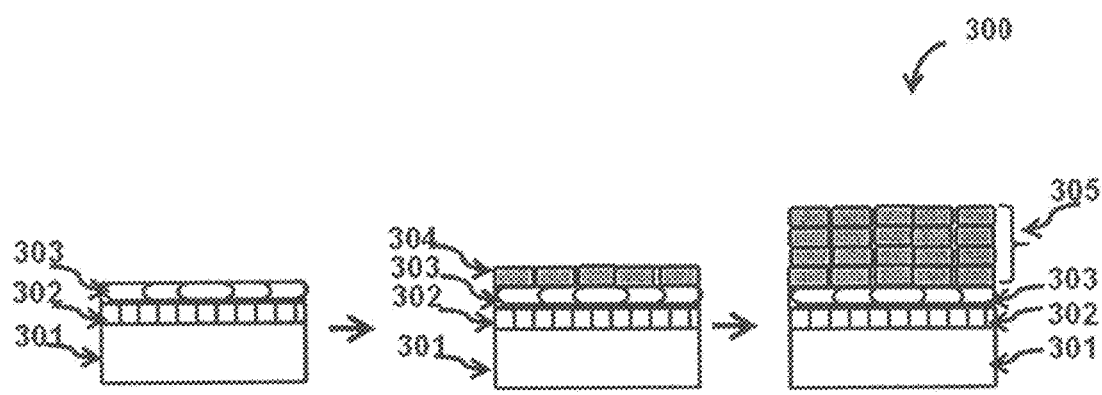
FIG. 3A is a schematic representation of an embodiment of an integrated composite perovskite oxide heterostructure material according to the present invention (300); where the $SrTiO_3$ lower layer (303) which overlies a bottom electrode (302) on a substrate (301) serves as a template to create a large grain microstructure in each spin coat layer (304) of the overlying Mg-doped BST60/40 upper layer film (305).
Figure 3B:
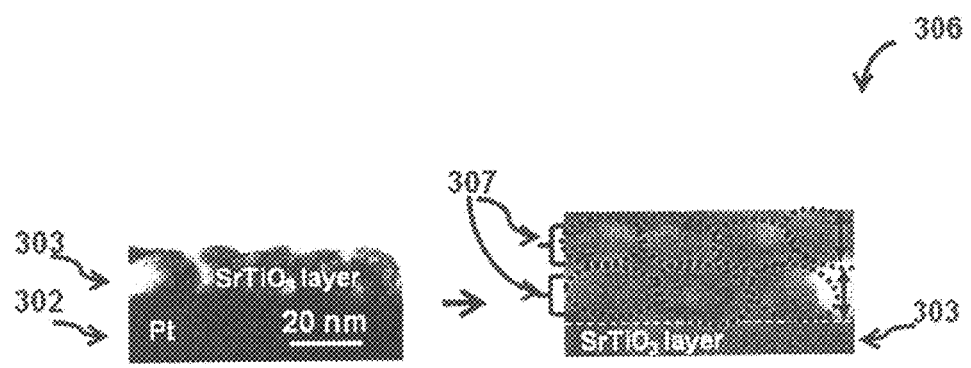
FIG. 3B is a reproduction of a cross-sectional view of a scanning electron microscope (SEM) micrograph showing the "template effect" (306) whereby each spin coated layer of the Mg-doped BST is composed of a large single grain microstructure (307) which mimics the microstructure of the thin SrTiO$_3$ lower layer film (303).

In preferred embodiments of the present invention, the film formation method to achieve a high permittivity BST-based film the $SrTiO_3$ lower layer, composed of a large single grain microstructure whose grains longest dimension is parallel to the substrate and the shortest dimension perpendicular to the substrate is employed as a "template" to create a large grain size microstructure in the over-lying BST film. Desirably to further ensure large grain size microstructure of the BST based film, the MOSD spin coat layer thickness is concentration and viscosity optimized to reduce the volume of nucleation, hence ensure the Mg-doped BST film growth from surface of the $SrTiO_3$ lower layer film. The $SrTiO_3$ lower layer surface produces nucleation sites to promote the heterogeneous nucleation and growth of the over-lying Mg-doped BST film, and when combined with the MOSD optimized spin coat layer thinness the Mg doped BST overgrowth film will preferentially nucleate on the surface of the crystallized $SrTiO_3$ lower layer film and not within the bulk film, hence large grains and/or textured films will result. Therefore the present invention is especially beneficial as the Mg-doped BST over-growth upper layer film will imitate/mimic the SrTiO₃ lower layer microstructure. FIG. 3A (300) illustrates the template effect of the present invention; whereby the SrTiO₃ lower layer (303) which overlies a bottom electrode (302) on a substrate (301) serves as a template to create a large grain microstructure in each spin coat layer (304) of the overlying Mg-doped BST60/40 upper layer film (305). FIG. 3B (306) is a reproduction of a cross-sectional view of a scanning electron microscope (SEM) micrograph showing the "template effect" whereby each spin coated layer of the Mg-doped BST is composed of a large single grain microstructure (307) which mimics the microstructure of the thin SrTiO₃ lower layer film (303).

In preferred embodiments of the present invention the stoichiometric precursor solution to create the 5-mol % Mg BST 60/40 film is concentration optimized as 0.23 M. Desirably, the precursor solution is spin-coated onto the crystallized SrTiO₃ lower layer at 6000 rpm for 50 seconds. After each coating, removal of the organic addenda is achieved by pyrolyzing the films on a hotplate at 350° C. for 10 minutes, followed by a thermal treatment for 10 min. in flowing oxygen at 700° C. The spin-coating, pyrolysis, and 10 min thermal treatment steps are repeated until the desired Mg doped BST60/40 film thickness is achieved. Crystallization of each spin coated Mg-BST layer further enhances and translates the template effect for creating thicker BST-based films with controlled and optimized large grain size microstructures.

In preferred embodiments of the present invention the final integrated perovskite oxide composite film heterostructure (SrTiO₃/Mg-BST) is crystallized via conventional furnace annealing (CFA) for 60 minutes at 700° C. in a flowing oxygen ambiance.

FIGS. 4A and 4B display the plan-view and 3-D atomic force microscope (AFM) images, respectively, which show that the MOSD growth of the Mg doped-BST film desirably promotes a uniform pin-hole (defect) free morphologically smooth surface, and therefore the present invention is especially beneficial to enable reliable integration, mitigate electrical shorts, with the top electrode and/or overlying FM film.

Desirably, the concentration optimized MOSD precursor solution beneficially influences the Mg doped BST film quality. The solution concentration is optimized as 0.23 M which promotes a dilute precursor solution to enable a thin amorphous film to be formed with each spin coat step. The carbonaceous decomposition products or organic addenda are efficiently burned (removed from the coating) using a "350° C./10 min. pyrolysis+700° C./10 min. thermal treatment" regime; thus few embedded impurities remain. In specific, at this preferred precursor solution concentration level, the spin coated layers are sufficiently thin, such that as each layer is deposited over the prior "pyrolyzed+thermally treated" layer it is able to cover/mask the pores and defects left behind by the burn-off of the organic addenda. A beneficial consequence is that during the final annealing step (700° C./60 min.) there are minimal imbedded impurities to burn off which mitigates undesirable pores, thereby producing a fully dense, well crystallized, pin-hole free surface, high quality BST60/40 film. Furthermore the "350° C./10 min. pyrolysis+700° C./10 min. thermal treatment" combined with the final crystallization annealing step (700° C./60 min.) promotes a smooth defect (pin-hole) free top film surface, hence allows reliable integration with all overlying films, mitigates electrical shorts and premature voltage breakdown.

Figure 5:
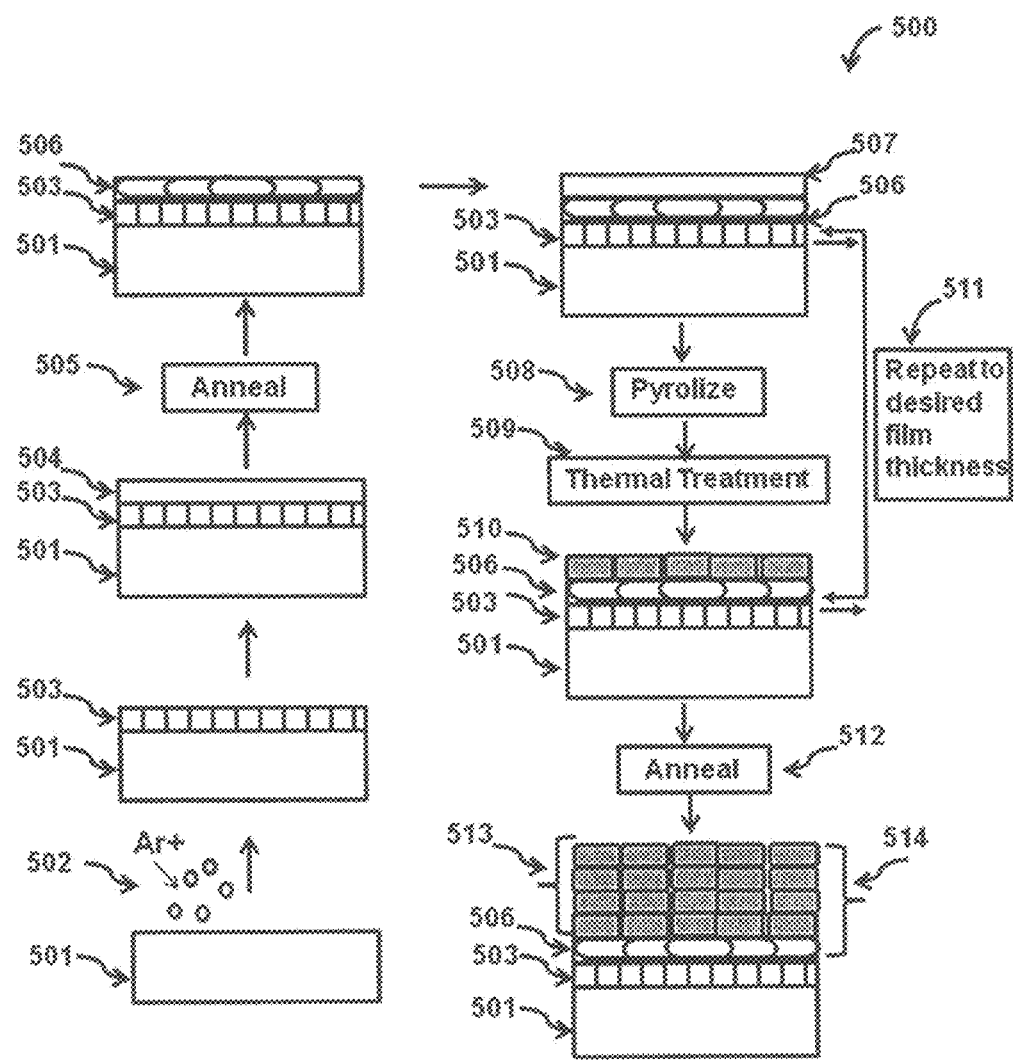
FIG. 5 is a flow diagram illustrating a process for fabricating an integrated composite perovskite oxide heterostructure material according to an embodiment of the present invention.

FIG. 5 shows a flow diagram (500) illustrating a process for fabricating an integrated composite perovskite oxide heterostructure material according to embodiments of the present invention. First a sapphire substrate support (501) is in situ purified by sputtering with Ar ions (502). A bottom electrode (BE) (503) is deposited on the substrate support (501) using DC sputter deposition, in particular embodiments of the present invention. Following bottom electrode deposition a SrTiO₃ film (504) is deposited on the BE (503) using RF sputter deposition. The RF sputter deposited SrTiO₃ film is post deposition annealed (505) via CFA at 700° C. for 60 min in flowing oxygen to create a fully crystallized SrTiO₃ film (506). The 5 mol % Mg-doped BST 60/40 overgrowth amorphous film (507) is spin coated on top of the crystallized SrTiO₃ film surface (506) via the metal-organic solution deposition (MOSD) technique. Following each spin coat, removal of the organic addenda is achieved by pyrolysis (508) followed by a temporally brief thermal treatment (509). For example, the deposited Mg-doped BST stoichiometric precursor solution is pyrolyzed (508) on a hotplate at a temperature of about 300 and 400° C., inclusive for a time in the range of about 10-15 min, inclusive; followed by a thermal treatment (509) in a quartz tube furnace in flowing oxygen ambiance at a temperature of about 700° C. for a time of about 10 min., inclusive, producing a quasi-crystalline layer (510). The spin-on film coating, pyrolysis and thermal treatment is repeated (511) until the desired film thickness is achieved. The final composite film heterostructure is fully crystallized via post deposition annealing (512), using a quartz tube furnace in a flowing oxygen ambiance at a temperature of 700 to 800° C. for a time of 60 minutes to several hours, inclusive. In preferred embodiments, post deposition annealing (512) is performed in flowing oxygen ambiance at a temperature of 700° C. for a time of 60 min., inclusive. Detection of full film crystallization is achieved, for instance by, materials characterization techniques such as x-ray diffraction (XRD) Scanning electron microscopy (SEM) and transmission electron microscopy (TEM). An inventive method of fabrication of the SrTiO₃—Mg doped BST60/40 heterostructure allows compositionally distinct films; e.g., the Mg-doped BST film (513) and the SrTiO₃ film (506), to be maintained without inter-diffusion of the constituent elements between the two compositionally distinct films/layers of the integrated composite SrTiO₃—Mg doped BST heterostructure (514). The structure and surface morphology of the heterostructure material is assessed by any of various techniques, illustratively including cross-section field emission scanning electron microscopy (FESEM), cross-sectional transmission electron microscopy (X-TEM) and atomic force microscopy (AFM).

An integrated composite SrTiO₃—Mg-doped BST thin film heterostructure material of the present invention is integrated into device architectures. For example, a vertical, that is parallel plate voltage controlled capacitor or varactor device (FIG. 1A), a coplanar tunable device (FIG. 1B), and a voltage controlled charge mediated magnetic device (FIG. 1C), described herein.

In particular embodiments of the inventive integrated SrTiO₃—Mg doped BST heterostructure material design and method of fabrication thereof, several material response properties of a beneficial nature are achieved:

The permittivity of the inventive composite heterostructure can be tailored as a function of the relative thickness of the SrTiO₃ layer ($\alpha$); $\alpha = h_1/((h_1+h_2)$ where $h_1$ is the thickness of the SrTiO₃ layer and $h_2$ is the thickness of the Mg-BST over-layer (i.e., the upper layer). The thinner the SrTiO₃ layer, the smaller fraction of the total film thickness and the smaller the value of $\alpha$; the higher the dielectric permittivity. For the present invention a high permittivity is achieved for $\alpha \leq 0.01$.

Table 1 (below) displays the experimental data demonstrating the material properties for the integrated composite perovskite oxide heterostructure material according to an embodiment of the present invention.

Table 1 displays the experimental data which shows that the inventive composite heterostructure and the method of

TABLE 1

| Identifier | $\epsilon_r$ (0 V) | tan δ | J (A/cm2) (100 kV/cm) | J (A/cm2) (300 kV/cm) | Tunability (%) 100 kV/cm [300 kV/cm] | Grain Size (nm) | Surface Roughness (nm) |
|---|---|---|---|---|---|---|---|
| Mg-BST Control | 380 | 0.029 | $5.6 \times 10^{-8}$ | $1.0 \times 10^{-5}$ | 10% [30.9%] | 49 | 1.57 |
| SrTiO$_3$ (9 nm) + Mg BST | 471 | 0.025 | $7.0 \times 10^{-9}$ | $4.5 \times 10^{-7}$ | 23.3% [56.4%] 65% @ 400 kV/cm | 105 | 2.50 |
| SrTiO$_3$ (17 nm) + Mg BST | 491 | 0.025 | $1.1 \times 10^{-8}$ | $5.6 \times 10^{-5}$ | 22.5% [55.9%] | 125 | 2.18 |
| SrTiO$_3$ (60 nmm) + Mg BST | 362 | 0.027 | $3.0 \times 10^{-8}$ | $4.1 \times 10^{-5}$ | 16.2% [29.6%] | 40 | 1.84 |

Generally, Table 1 displays the experimental material property data for an integrated composite heterostructure with the thickness of the SrTiO$_3$ lower layer varying from 9-41 nm and for a uniform composition 5 mol % Mg doped BST60/40 film without a SrTiO$_3$ lower layer, referred to as the control sample, herein. According to an embodiment of the present invention, the inventive composite heterostructure, is effective to elevate the permittivity by ~30 to 36% with respect to uniform composition Mg-doped BST (control) film (i.e., $\epsilon_r$ increases from 380 to 491) for thickness of SrTiO$_3$ greater than or equal to 9 nm and less than or equal to 20 nm, for a total bilayer (h$_1$+h$_2$) thickness of 200 nm. In addition the tunability for the inventive integrated composite heterostructure is increased by 86% @ 300 kV/cm and 130% at 100 kV/cm with respect to the control uniform composition 5 mol % Mg doped BST 60/40 film. Notably, a thick (41 nm) SrTiO$_3$ lower layer incorporated into the integrated composite heterostructure serves to significantly diminish the permittivity and tunability. Further, the heterostructure material, inclusive of the SrTiO$_3$ lower layer thickness ranging from 9 to 17 nm in thickness, is effective to maintain a dielectric loss less than or equal to 2.5% within the elevated permittivity range of 471 to 491. FIG. 6 is a graph (600) showing the permittivity as a function of applied electric field for the integrated composite heterostructure with SrTiO$_3$ lower layer thickness of 9 nm (trace 601/filled triangles), 17 nm (trace 602/open squares); for reference a uniform composition 5 mol-% Mg doped BST60/40 control film (trace 603/open circles) and a composite heterostructure composed of a 41 nm SrTiO$_3$+5-mol % Mg-doped BST60/40 composite material (trace 604/filled squares) are also shown.

FIG. 7 is a graph showing the frequency dependence of permittivity for the integrated composite heterostructure with SrTiO$_3$ lower layer thickness of 9 nm (trace 701/open triangles) and 17 nm (trace 702/filled circles). The inventive composite heterostructure is effective to promote frequency stable dielectric response. Desirably, the dielectric permittivity does not show any appreciable dispersion over a broad frequency range from 10 kHz to 1 MHz. Frequency performance stability is an important device characteristic; a device employing the inventive heterostructure has a frequency independent dielectric response, thus its performance properties remain constant/stable with respect to device operational frequency. In specific the inventive integrated composite heterostructure material enables stable performance over a broad frequency range, hence is frequency agile.

fabrication thereof, inclusive, is effective to maintain a low dielectric loss less than or equal to 2.5% within the elevated permittivity range of 471 to 491. Low dielectric loss enhances or maximizes the systems communication signal in both transmit and receive modes. High permittivity associated with the inventive integrated composite heterostructure enables device miniaturization. Maximizing the dielectric response/permittivity of BST is critical for realizing RF/MW device miniaturization. For tunable BST-based RF/MW devices (e.g. resonators etc.) the size of the device at any particular resonant frequency depends on the inverse square root of the dielectric constant of the BST film, thus the larger the dielectric constant the smaller the device/component. Therefore, the highest dielectric permittivity of the inventive heterostructure ensures device miniaturization as well as enhanced tunability. Miniaturization beneficially decreases device size and weight. High tunability beneficially reduces part count and cost in a system architecture. For charge mediated voltage controlled magnetic devices (FIG. 1C) the high dielectric permittivity associated with the inventive integrated composite heterostructure serves to facilitate more charge for a given applied field, hence enhancing the magnetoelectric (ME) coupling coefficient to enable an enhanced magnetic response. Charge mediated voltage controlled magnetic devices enabled by the high permittivity inventive heterostructure eliminate the need for biasing magnetic devices with a large magnet and enable integrated on-chip nonreciprocal devices with improved Size Weight and Power (SWaP) Figure-of-Merit. Permanent magnets require manual calibration which makes the current technology expensive (~$700/device). Charge mediated voltage controlled magnetic devices eliminate need for mechanical tuning on assembly line and decrease production cost, allows faster calibration. Nonreciprocal components offer relatively narrow bandwidths vs. reciprocal devices. Charge mediated voltage controlled magnetic devices offer frequency agility of nonreciprocal devices; extend effective bandwidth (BW), thus enhances performance. Thus, compared to state of the art nonreciprocal and/or tunable RF/microwave magnetic devices that are controlled by electromagnets, such voltage tunable RF/microwave devices, enabled by the converse magnetoelectric effect and the high dielectric permittivity of the inventive heterostructure, would be more compact, lightweight and power efficient.

An inventive integrated heterostructure material included in a voltage tunable device such as a variable capacitor or varactor confers the advantages of high tunability. Tunability (η) is defined as $\eta=\Delta C/C_o$, where $\Delta C$ is the change in capacitance relative to zero-bias capacitance $C_o$, is an important performance parameter which is a function of applied bias. Generally, for a tunability value to be of practical use in device structures it must be obtained in concert with low dielectric loss and leakage currents.

In particular embodiments involving the inventive integrated heterostructure material in an MIM tunable capacitor configuration, the dielectric tunability is 56% at 300 kV/cm and 65% at 400 kV/cm. Specifically the tunability of the tunable device, such as a phase shifter, including the inventive integrated heterostructure is increased by 86% with respect to that of MOSD fabricated uniform composition 5-mol % Mg doped BST60/40 (Table 1). Further, the enhanced tunability is achieved in concert with low loss ~2.5% and low leakage current density ~$10^{-6}$ A/cm$^2$ range.

Enhanced elevated tunability at a low applied field exhibited by the inventive integrated heterostructure material is important since, for example, in a tunable device/phase shifter circuit, higher tunability allows for fewer tuning elements which are cascaded to achieve the desired phase shift. The decrease in the amount of tuning elements directly reduces the net circuit loss. The net decrease in amount of tuning elements lowers the system cost. In another example, tunable filter, a high tunability over a broad frequency range enables fewer filter banks to be incorporated into a system, hence reduces the part/component count and cost.

Desirably, the high tunability is accomplished at low voltage levels, i.e., less than 10 volts, which is compatible with the voltage requirements of present day semiconductor systems.

Leakage current is a very sensitive material property and can be considered a measure of film quality. Since most devices operate under DC bias or pulsed-DC electrical load low leakage currents over a large range of applied voltage are desirable. Furthermore, leakage current is a power loss mechanism that can result in battery drain and thus a low leakage current is required to minimize power consumption or battery draw of a device. Leakage current characteristics are influenced by many factors such as film-electrode interface characteristics, electrode composition and structure, deposition and annealing conditions, defects (oxygen vacancies under the electric field migrate towards the electrode and aggregate near the electrode interface), and the film microstructure and composition.

Table 1 displays experimental data which shows that an inventive integrated composite heterostructure material is effective to reduce the leakage current density characteristics by a maximum of 87.5% at an applied field of 100 kV/cm, inclusive with respect to uniform composition Mg-doped BST films. (9 nm/7.0×$10^{-9}$ vs. uniform composition Mg-BST films/56.0×$10^{-9}$ A/cm$^2$).

Further, Table 1 displays experimental data which shows that an inventive integrated heterostructure material is effective to reduce the leakage current density characteristics by a maximum of 95.5% at an applied field of 300 kV/cm, inclusive; hence the present invention serves to promote enhanced breakdown field strength. In specific the inventive integrated heterostructure material showed no evidence of voltage breakdown at high electric field ≥300 kV/cm.

The forward leakage characteristics are determined by the film and the bottom electrode (Pt)/film (SrTiO$_3$) interface. The inherent low loss nature of the SrTiO$_3$ film in direct contact with the Pt bottom electrode, promotes minimization of the inventive integrated composite perovskite oxide composite heterostructure's leakage current density. Further, the film-bottom electrode interface plays a major role in defining the materials leakage current characteristics. As shown in FIG. 2A (200), the abrupt smooth defect and void free SrTiO$_3$ (203)-BE (201) interface (202) without undesirable secondary interfacial phases of the inventive integrated composite perovskite oxide composite heterostructures is desirable for achieving low leakage current densities and high break down field fields.

Film microstructure also influences a film's insulation properties. A large-grain size microstructure yields less grain boundary area, and since grain boundaries serve as high-leakage paths, leakage currents can be reduced by increasing the average grain size. Desirably, a large grain and/or textured microstructure SrTiO$_3$ lower layer film according to an embodiment of the present invention is formed by RF sputtering. In specific, the SrTiO$_3$ lower layer is a continuous film composed of large grains (blocky quasi-columnar microstructure) whose longest dimension is parallel to the substrate and shortest dimension is perpendicular to the substrate spanning the entire thickness of the film (FIG. 2). Desirably, the large grain size microstructure with its minimal grain boundary area in combination with the "template effect" to create a large grain size microstructure in the over-lying BST film (FIG. 3A, 3B) enables low leakage current density and high breakdown voltage strength (Table 1). Low leakage current densities and high voltage breakdown strength beneficially promotes low battery/power draw (power savings) and ensures material/device long-term operational reliability.

More specifically, an inventive integrated heterostructure material design inclusive of the large grain size RF sputter deposited 9 and 17 nm SrTiO$_3$ lower layer combined with the viscosity and molarity optimized Mg-doped-BST60/40 spin coat precursor solution is effective to control the microstructure of the overlying BST film. More specifically, as shown in FIG. 3 each layer of the MOSD Mg-doped BST film is composed of large single grains with vertical dimensions extending the full spin coated layer thickness (307). The single grain layer structure is contrary to that of traditional MOSD fabricated films which consists of a randomly orientated small-size multi-grain microstructure distributed throughout the entire film thickness. This result demonstrates that the SrTiO$_3$ lower layer (303) serves as a template to modify the microstructure of the Mg-doped BST film over-growth/upper layer (307, 305) in a desirable fashion, i.e., enhanced grain size. In specific, this template effect is effective to enhance the grain size of the composite heterostructure film within the range of 114% to 155% compared to uniform composition 5 mol % Mg-doped-BST60/40 films (Table 1).

The excellent leakage characteristics in conjunction with the fact that the change in film leakage current in response to applied bias from 100 to 300 kV/cm is small, dielectric breakdown, with its associated high leakage current density characteristics, or failure is not an issue. It is known that the breakdown field of BST thin films increases with decreasing grain size. The inventive material design and fabrication methodology thereof, inclusive, enables the template effect, to promote a large grain microstructure in the Mg doped-BST 60/40 film (FIG. 3A, 3B) in concert with a smooth pin-hole free surface morphology (FIG. 4A) is beneficial to reduce the leakage current density of the heterostructure and promote reliable integration with an overlying electrical contact and/or other film.

There is a notable variation in grain size of the Mg-doped BST upper layer film as a function of the lower SrTiO$_3$ layer thickness within the integrated composite perovskite oxide heterostructure material. For example, data presented in Table 1 shows that the uniform composition 5-mol % Mg doped BST60/40 without a $SrTiO_3$ lower layer (control film) and a thick, 41 nm, $SrTiO_3$ lower layer-Mg doped BST composite film heterostructure possess similar and significantly smaller grain size (49 and 40 nm) with respect to that of the inventive 9 and 17 nm integrated composite film heterostructure, with grain sizes of 105 and 125 nm, respectively. It is well established that a larger grain size leads to a larger dielectric permittivity. Generally, a smaller grain size lowers the permittivity due to the larger percentage of grain boundary area. Grain boundaries are considered as "disrupted regions" of the film, which are believed to possess a lower permittivity than the bulk material. For example, it is established that, in BST 50/50 thin films with a relative dielectric permittivity of ~200-700, the permittivity of the grain boundary region may be as low as 40. For RF sputtered $SrTiO_3$ films it has been established that there exists an excess Ti associated with grain boundaries as a $TiO_{2-x}$ phase. For sputter deposited $SrTiO_3$ films the cause of the excess Ti is also attributed to re-sputtering and/or re-evaporation. It is generally known that a large excess of Ti can decrease the dielectric permittivity significantly. FIG. 8 displays a schematic-model showing the excess Ti accumulation (804) in the grain boundary of the $SrTiO_3$ films as the sputter time and the resultant film thickness is increased. The $SrTiO_3$ films illustrated in FIG. 8 are sputtered deposited on a bottom electrode (802) overlying a substrate support (802). The measured permittivity values tabulated in Table I, and shown graphically in FIG. 6, are the effective permittivity ($\epsilon_{eff}$) of the composite films which includes the permittivity of both the $SrTiO_3$ lower layer ($\epsilon_{SrTiO3LL}$) and the Mg-BST overgrowth film ($\epsilon_{Mg-BST-overgrowth}$). In other words, the composite heterostructure is electrostatically coupled and the two films, as a first order approximation, can be considered as a capacitor configuration "connected in series". Considering the increased sputter deposition time (and increased $SrTiO_3$ layer thickness) with its associated continual re-sputtering and/or re-evaporation effects of excess Ti, it is suggested that the thicker, 41 nm, sputtered $SrTiO_3$ film (805) (longer sputter time of 60 minutes) would have a higher contribution of low permittivity material, $TiO_{2-x}$ phase (804), incorporated into the grain boundary versus that of shorter sputter time (9 and 17 nm) $SrTiO_3$ films (803). The results tabulated in Table 1 demonstrate that the composite films' composed of the thinner $SrTiO_3$ lower layer films, 9 and 17 nm (803) with their shorter respective sputter times, 13 and 25 minutes, possess the highest permittivity values ($\epsilon_{eff}$ of 471 and 491) with respect to that of the composite film with the considerably thicker 41 nm/60 min. sputter time ($\epsilon_{eff}=362$) $SrTiO_3$ film (805). Thus, thinness of the $SrTiO_3$ lower layer film ensures minimization of the low permittivity grain boundary phase which would depress the dielectric permittivity. The low permittivity of the control uniform composition 5 mol %-Mg doped BST film is attributed to its small grain size microstructure.

The combination of shorter sputter times for the thinner (9 and 17 nm) $SrTiO_3$ lower layers, hence smaller amount of low permittivity material within the grain boundaries, in concert with the larger grain MOSD overgrowth film (due to the "template-effect" from the large grain microstructure $SrTiO_3$ lower layer film) is responsible for the larger net or effective permittivities of these films with respect to the composite heterostructure film with the significantly thicker, 41 nm $SrTiO_3$ lower layer and the uniform composition Mg-BST control film. Furthermore, the fact that the grain size of the composite film with the thickest (41 nm) $SrTiO_3$ lower layer is approximately three-times smaller than the composite films with the thinner lower layers suggests that there is a critical thickness, h*(9 nm≤h*<41 nm) whereby the benefit of the "sputter deposited—$SrTiO_3$ lower layer template effect" to increase the BST based over-growth film grain size is diminished, hence the attributes of the "template effect" to modify/enhance grain size of the over-growth Mg-BST film microstructure is lost, i.e. the Mg-BST film over-growth film will not imitate/mimic the $SrTiO_3$ layer microstructure. In such a case the composite film behaves simply as a normal two-layer or bi-layer heterostructure without the template benefits. Additionally, since the $SrTiO_3$ lower layer is thicker (41 nm), there is more grain boundary area in the Z-direction (columnar grains via sputtering), thus the detrimental effects of $TiO_{2-x}$ phase is elevated with respect to that of the thinner $SrTiO_3$ lower layer composite film heterostructures. Therefore, for the integrated $SrTiO_3$—Mg doped BST composite heterostructure the "template-effect" is successful to enhance the dielectric permittivity, while at the same time the acceptor doping (Mg) of the BST upper layer film offers the benefit of low dielectric loss.

Experimental results tabulated in Table 1 and the plan view and 3-D AFM micrographs shown in FIG. 4A, 4B, the inventive integrated heterostructure material is effective to maintain smooth (a <2.5 nm) pinhole free surface morphologies, hence allows reliable integration with overlying films and/or electrode materials.

Furthermore, the material and related process science must be foundry friendly, standard to the semiconductor industry and/or CMOS compatible to insure affordable IC integration and manufacturability. In other words, for an integrated $SrTiO_3$—Mg doped thin film heterostructure material innovation to be useful and employed in engineering applications it must be commercially viable. To be commercially relevant thin film processes technologies must enjoy the economy of scale and affordability associated with the semiconductor industry. Thus the film growth fabrication processes must possess the semiconductor industry-standard attributes to include, but not limited to: [1] low cost large diameter substrate type (e.g., Si, GaAs/III-V, sapphire etc. with wafer diameters ≥4 inches); [2] large area, cost and time effective film growth (sputtering, e-beam, CVD, dip/spin coating etc.); [3] low to moderate process temperatures to facilitate materials integration and the required lithographic, etching, and passivation process steps ($T_{process} \leq 800°$ C.); [4] compatibility with foundry cluster tools (e.g. wafer size and temperature requirements, utilize standard growth tools). The integrated thin film heterostructure and fabrication methods thereof, are low temperature (≤800° C.), large area (scalable to 12 inches), employ integration compatibility with substrate support wafers used in the semiconductor industry (sapphire, Si and III-V substrates) and utilize industry standard film growth/deposition tools.

An integrated heterostructure material is achieved by combining the attributes of two perovskite oxide film growth methods, RF sputtering and MOSD, in combination with employing a novel material design consisting of a $SrTO_3$ thin film layer which serves as a template to achieve a property enhanced, i.e., elevated $\epsilon_r$ BST based film overgrowth. In specific the integrated materials design consists of a thin RF sputtered $SrTiO_3$ film (lower layer) which underlies a substantially thicker MOSD over-growth BST-based film (upper layer). Both film growth techniques are foundry friendly, cost effective, offer high deposition rates and yield large area films. More specifically, the processing methods are low temperature (<800° C.), large area (scalable to 12 inches), employ integration compatibility with substrate support wafers used in the semiconductor industry (sapphire, Si and III-V substrates) and utilize industry standard film growth/deposition tools.

I claim:

1. A composite material comprising:
   a substrate,
   a layer of crystallized $SrTiO_3$ perovskite oxide overlying said substrate,
   a layer of doped $Ba_{1-x}Sr_xTiO_3$ perovskite oxide overlying said layer of crystallized $SrTiO_3$,
   at least one electrode overlying at least a portion of said layer of doped $Ba_{1-x}SrTiO_3$ perovskite oxide, and
   a further electrode interposed between at least a portion of said layer of crystallized $SrTiO_3$ perovskite oxide and said layer doped $Ba_{1-x}Sr_xTiO_3$ perovskite oxide.

2. The composite material as defined in claim 1 and comprising an adhesion layer between said substrate and said further electrode.

3. The composite material as defined in claim 2 wherein said adhesion layer is selected from the group consisting of titanium, chromium, palladium and alloys thereof.

4. The composite material as defined in claim 2 wherein said a layer of doped $Ba_{1-x}Sr_xTiO_3$ perovskite oxide is doped with an acceptor dopant selected from the group consisting of $Ni^{2+}$, $Al^{2+}$, $Ga^{3+}$, $Mn^{2+,3+}$, $Fe^{2+,3+}$, $Mg^{2+}$, $Co^{2+,3+}$, $In^{3+}$, $Cr^{3+}$, and $Sc^{3+}$.

5. The composite material as defined in claim 1 wherein said a layer of doped $Ba_{1-x}Sr_xTiO_3$ perovskite oxide is doped with magnesium.

6. The composite material as defined in claim 5 wherein a concentration of said magnesium is 5-mol %.

7. The composite material as defined in claim 1 wherein said layer of doped $Ba_{1-x}Sr_xTiO_3$ perovskite is crystallized.

8. The composite material as defined in claim 1 wherein said x is in the range of 0.36-0.44.

9. The composite material as defined in claim 1 wherein said layer of crystallized $SrTiO_3$ perovskite oxide is deposited by RF sputtering.

10. The composite material as defined in claim 1 wherein said layer doped $Ba_{1-x}Sr_xTiO_3$ perovskite oxide is deposited by metallo-organic solution deposition.

11. The composite material as defined in claim 9 wherein said layer of $SrTiO_3$ has a thickness of 9-17 nanometers.

12. A composite material comprising:
    a substrate,
    a layer of crystallized $SrTiO_3$ perovskite oxide overlying said substrate,
    a layer of doped $Ba_{1-x}Sr_xTiO_3$ perovskite oxide overlying said layer of crystallized $SrTiO_3$,
    at least one electrode overlying at least a portion of said layer of doped $Ba_{1-x}SrTiO_3$ perovskite oxide and
    a further electrode interposed between at least a portion of said layer of crystallized $SrTiO_3$ perovskite oxide and said layer doped $Ba_{1-x}Sr_xTiO_3$ perovskite oxide
    wherein said a layer of doped $Ba_{1-x}Sr_xTiO_3$ perovskite oxide is doped with an acceptor dopant selected from the group consisting of $Ni^{2+}$, $Al^{2+}$, $Ga^{3+}$, $Mn^{2+,3+}$, $Fe^{2+,3+}$, $Co^{2+,3+}$, $In^{3+}$, $Cr^{3+}$, and $Sc^{3+}$.

13. The composite material as defined in claim 12 wherein said a layer of doped $Ba_{1-x}Sr_xTiO_3$ perovskite oxide is doped with magnesium.

14. The composite material as defined in claim 12 wherein a concentration of said magnesium is 5-mol %.

15. The composite material as defined in claim 12 wherein said x is in the range of 0.36-0.44.

16. The composite material as defined in claim 12 wherein said layer of crystallized $SrTiO_3$ perovskite oxide is deposited by RF sputtering.

17. The composite material as defined in claim 12 wherein said layer doped $Ba_{1-x}Sr_xTiO_3$ perovskite oxide is deposited by metallo-organic solution deposition.

18. The composite material as defined in claim 16 wherein said layer of $SrTiO_3$ has a thickness of 9-17 nanometers.

19. A composite material comprising:
    a substrate,
    a layer of crystallized $SrTiO_3$ perovskite oxide overlying said substrate,
    a layer of doped $Ba_{1-x}Sr_xTiO_3$ perovskite oxide overlying said layer of crystallized $SrTiO_3$ and x is in the range of 0.36-0.44,
    at least one electrode overlying at least a portion of said layer of doped $Ba_{1-x}SrTiO_3$ perovskite oxide and
    a further electrode interposed between at least a portion of said layer of crystallized $SrTiO_3$ perovskite oxide and said layer doped $Ba_{1-x}Sr_xTiO_3$ perovskite oxide
    wherein said a layer of doped $Ba_{1-x}Sr_xTiO_3$ perovskite oxide is doped with an acceptor dopant selected from the group consisting of $Ni^{2+}$, $Al^{2+}$, $Ga^{3+}$, $Fe^{2+,3+}$, $Mg^{2+}$, $Co^{2+,3+}$, $In^{3+}$, $Cr^{3+}$, and $Sc^{3+}$
    and further wherein said a layer of doped $Ba_{1-x}Sr_xTiO_3$ perovskite oxide is doped with magnesium, and the concentration of said magnesium is 5-mol %.

* * * * *